United States Patent
Runyon et al.

(10) Patent No.: US 6,582,983 B1
(45) Date of Patent: Jun. 24, 2003

(54) METHOD AND WAFER FOR MAINTAINING ULTRA CLEAN BONDING PADS ON A WAFER

(75) Inventors: Robert Carrol Runyon, Sun City West, AZ (US); Che Kiong Hor, Perak (MY)

(73) Assignee: Keteca Singapore Singapore (SG)

( * ) Notice: Subject to any disclaimer, the term of this patent is extended or adjusted under 35 U.S.C. 154(b) by 0 days.

(21) Appl. No.: 10/193,842

(22) Filed: Jul. 12, 2002

(51) Int. Cl.[7] .............................................. H01L 21/00
(52) U.S. Cl. ........................... 438/33; 438/68; 438/113; 438/114; 438/115; 438/458; 438/462; 438/476; 438/612; 438/976
(58) Field of Search ..................... 438/33, 68, 113–115, 438/458, 462, 476, 612, 976

(56) References Cited

U.S. PATENT DOCUMENTS

| | | | | |
|---|---|---|---|---|
| 5,923,995 A | * | 7/1999 | Kao et al. ................... | 438/462 |
| 6,465,329 B1 | * | 10/2002 | Glenn ......................... | 438/462 |
| 2001/0042902 A1 | * | 11/2001 | Wakabayashi et al. ...... | 257/620 |
| 2002/0039807 A1 | * | 4/2002 | Koyama ..................... | 438/113 |
| 2002/0093076 A1 | * | 7/2002 | Fujii et al. .................. | 257/620 |

* cited by examiner

Primary Examiner—John F. Niebling
Assistant Examiner—Lynne A. Gurley
(74) Attorney, Agent, or Firm—John B. Sowell

(57) ABSTRACT

The present invention teaches a sawn wafer with ultra clean bonding pads on die which enhance the strength of wire bond and results in higher yield and improved reliability of packaged semiconductor die. Clean wafers ready for dicing are coated with a removable insulating water soluble non-ionic film which enhances clean saw cuts and reduces buildup. The protective film is hardened by heat and resists removal by cooling water used in dicing saws. However, after dicing the protective film is removable in a wafer washer using high pressure warm D.I. water. After removal of the protective film the electrode pads are virtually as clean as before dicing. The film may be used as a protective layer until the sawn wafer is ready for use.

11 Claims, 6 Drawing Sheets

METHOD AND WAFER FOR MAINTAINING
ULTRA CLEAN BONDING PADS ON A
WAFER

BACKGROUND OF THE INVENTION

1. Field of the Invention

The present invention relates to sawing and singulating semiconductor devices prior to a final assembly step into or onto a carrier, lead frame, substrate or Printed Circuit (PC) board. More particularly, the present invention relates to a method and a means for maintaining bonding pads or bumps ultra clean during a sawing or singulation process.

2. Description of the Prior Art

Heretofore, dicing saws fitted with thin dicing saw blades have been employed to cut streets or kerfs between individual die on a wafer mounted on a dicing tape or NITTO™ tape named for the largest supplier of dicing tapes. The sawing operation creates very fine silicon dust that deposits onto the die and covers the bonding pads or electrodes on the die. Even though the state of the art dicing saws employ cooling water and cleaning water during the sawing operation it is necessary to wash the wafer in a wafer washer after sawing the wafer to remove silicon dust that collects in the recessed bonding pads.

Cooling water is sprayed onto the wafer and/or the saw blade at the kerf being cut. Even though deionized (D.I.) water is used for cutting and washing the wafer, friction can cause electrostatic discharge (ESD) that in turn may be great enough to damage state of the art semiconductor devices, but also causes poor wetting of the silicon dust which results in dry spot contamination of the bonding pads. Unless the silicon dust is completely removed wire bonding and bond reliability problems will result.

It is known that silicon dust particles build up on the blade of the wafer. These particles cause blade loading which shortens blade life and also causes chipping on the bottom of the wafer where the moving blade is exiting or leaving the cut.

D.I. water available at semiconductor plants has a conductivity level of 16 to 18 Meg Ohms per centimeter. If processed in house by CO2 known techniques and steps, ultra clean D.I. water can be produced which measures up to 1 (one) Meg Ohm per centimeter, and reduces ESD. This special very clean D.I. water comes with a cost. A state of the art dicing saw uses fifty gallons per hour. A wafer washer uses three to ten gallons of D.I. water per hour. The wash cycle and cooling water may be varied to reduce the dust spots on the bonding pads. It is possible to add surfactant wetting and cleaning solution to the wash and cooling water to achieve greater than 95% dust free bonding pads and to use less D.I. water.

It would be highly desirable to provide a method and means for eliminating the need for most if not all high cost ultra clean D.I. water used in dicing saws and wafer washers and at the same time increasing the dust free percentage area on bonding pads so as to enhance the strength of wire bonds.

SUMMARY OF THE INVENTION

It is a primary object of the present invention to provide a semiconductor wafer with virtually dust free surfaces and bonding pads.

It is a primary object of the present invention to provide a novel method of preventing silicon dust build up on wafers and bonding pads of die.

It is a primary object of the present invention to eliminate the need for all or most of all ultra-clean D.I. water and the use of CO2 processing of D.I. water.

It is a primary object of the present invention to provide a method which virtually eliminates die chipping at the bottom surface of a wafer.

It is a primary object of the present invention to provide a water-soluble removable non-ionic protective film for wafers during sawing operations.

It is a primary object of the present invention to provide an electrostatic discharge protective coating over conductive bonding pads and the wafer during sawing operations.

It is a primary object of the present invention to provide a removable water-soluble non-ionic film for silicon wafers.

It is a general object of the present invention to provide a method for virtually eliminating the need for D.I. water when performing sawing operations.

It is a general object of the present invention to provide a method which requires less very clean D.I. water when performing wafer washing operations and virtually eliminates the need for ultra-clean D.I. water.

According to these and other objects of the present invention clean wafers ready to be diced are coated with a removable water-soluble non-ionic film made from a gel, paste, or spray of a viscous liquid that is hardened by heat such as ultraviolet, infrared, or convection. The hardened film is non-soluble in cool water used for dicing, but is removable after dicing in a wafer washer using warm water and high water pressure. The protective coating virtually eliminates wafer dust deposits in the recessed bonding pads of the sawn die.

DESCRIPTION OF THE PREFERRED EMBODIMENTS

Figure 1:
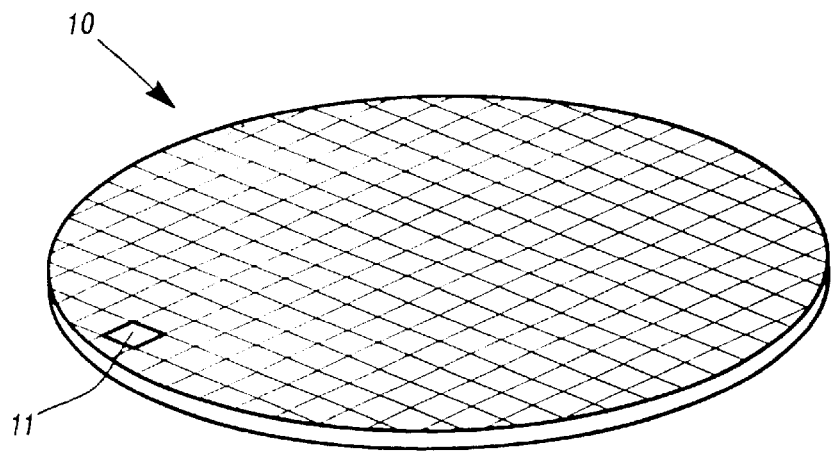
FIG. 1 is an isometric view of a prior art clean silicon wafer before being mounted on a dicing tape and sawn into individual die.

Refer now to FIG. 1 showing an isometric view of a prior art clean silicon wafer 10 before being mounted on a dicing tape and sawn into individual die 11.

In the early years of dicing wafers into individual die, D.I. water was used to lubricate and cool the diamond dicing blade. The dicing blades must be cooled to prevent heat from building up similar to a grinding wheel or cutoff wheel. Excessive heat destroys the thin dicing blade and the silicon wafer. D.I. water cools the blade and helps keep the wafer clean. Sub-micron size silicon dust from the dicing operation produces particles which are very difficult to wet and tends to accumulate on the wafer surface, particularly on the bonding pad areas where gold or aluminum fine wires are bonded to make the interconnection to the carrier package. Most present day die are covered with a thin layer of passivation to protect and insulate the circuitry on the wafer from damage during processing. However, the bonding pads of gold, copper or aluminum do not have the passivation layer. The bonding pads are bare exposed metal and are below the surface of the passivation layer. Each bonding pad is like a shallow well on the die. Silicon dust in most part will be washed off the wafer surface during the dicing and after washing operations. However, the bonding pads accumulate the silicon dust as the dicing cooling water runs off the wafer during dicing. The lowered surface of the bonding pads trap the dust as the water runs off the wafer. Larger wafers with smaller die create more silicon dust to contaminate the bonding pads. In recent years, the dicing operations have adapted the use of surfactants to reduce the surface tension of the D.I. water and help remove the silicon dust off the wafer surface. While surfactants have been somewhat successful in cooling the blade and cleaning the wafer, it has not been fully successful in keeping the bonding pads clean. If there is an excess of silicon dust on the bonding pads, it reduces the bond strength of the gold, copper or aluminum wire bond. The contaminated bonding pad can cause the circuit to fail after the device has been bonded and packaged and installed into some electronic system. Clean bonding pads will increase semiconductor yields and improve reliability.

Figure 2:
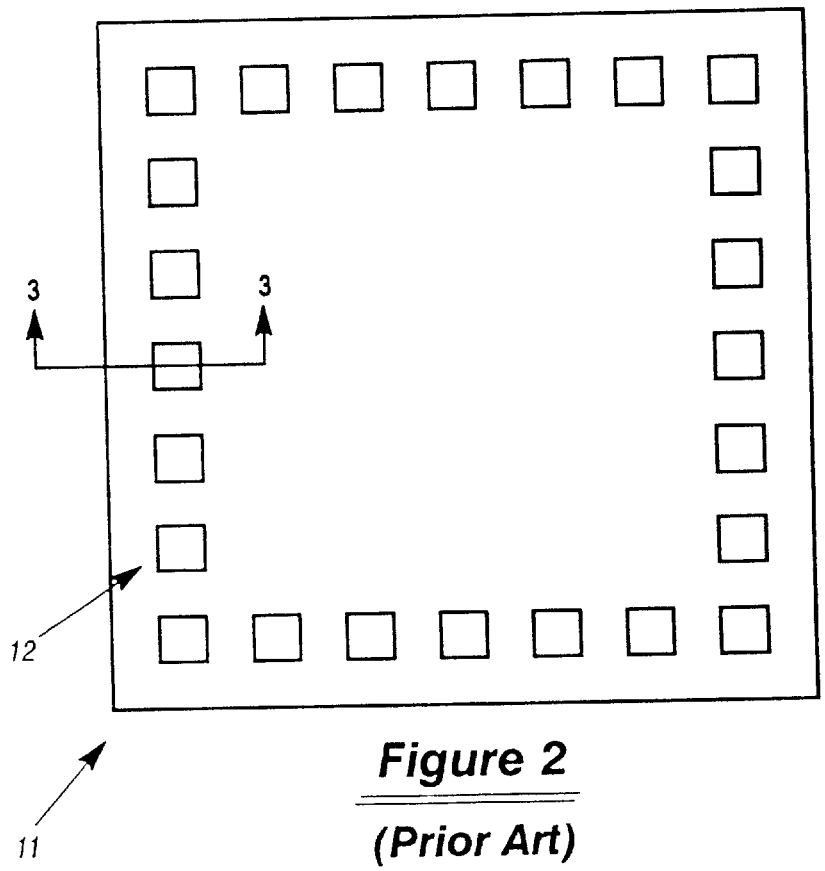
FIG. 2 is an enlarged plan view of a prior art single die after being sawn or diced from a wafer showing a plurality of bonding pads.

Refer now to FIG. 2 showing an enlarged plan view of a prior art single die 11 having several recessed bonding pads 12. Such die may have over 100 bonding pads on each side, thus, the die 11 shown is for illustration purposes. In a preferred embodiment, the die 11 is bonded onto a lead frame (not shown) and the electrode or pads 12 are bonded with wires which connect the pads 12 to fingers or lead out pads (not shown).

Figure 3:
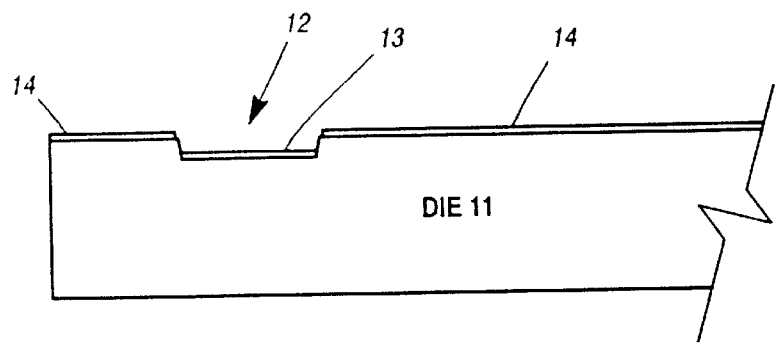
FIG. 3 is an enlarged section in elevation taken through a bonding pad at lines 3—3 of FIG. 2.

Refer now to FIG. 3 showing an enlarged section in elevation taken through a bonding pad 12 of FIG. 2.

The bonding pad 12 comprises a layer of conductive material 13 such as gold, aluminum or copper that connects to the circuitry (not shown) in and on the die 11. The recessed bonding pad 12 provides a trap for sub-micron silicon dust that is not easily removed in a wafer washer. The die 11 is preferably covered with a passivation layer 14 that is both insulative and protective of the circuitry in and on the die. If a sufficient static charge is applied to the electrode 12, the circuitry on the die 11 may be destroyed. It is important to avoid ESD during the sawing and washing operation of a wafer 10.

Figure 4:
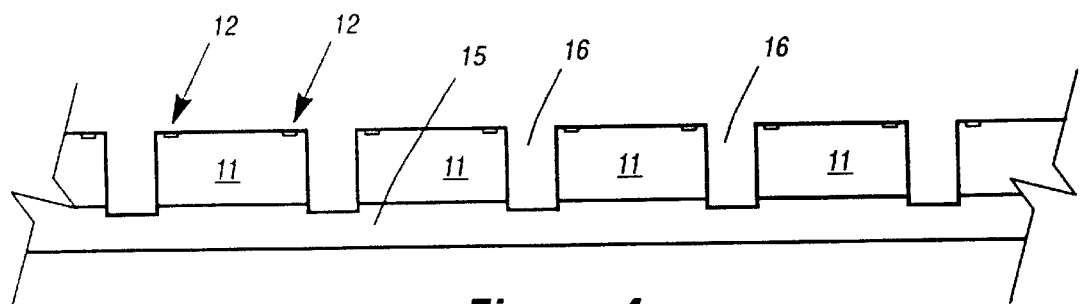
FIG. 4 is an enlarged section in elevation taken through several die of a prior art wafer mounting on an adhesive dicing tape after being sawn through the full depth of the wafer and into the dicing tape.

Refer now to FIG. 4 showing an enlarged section in elevation taken through several die 11 of a prior art wafer 10 that was mounted on a dicing tape 15. The prior art street or kerf 16 is shown extending into the dicing tape up to $\frac{1}{1000}$ of an inch completely severing one die 11 from the other. The die are usually 6 to 20 one thousandths of an inch thick (Mils) and vary in size from 18 Mils on a side to about 450 Mils.

A wafer 10 of die 11 sawn and washed as shown in FIG. 4 can be used in a die bonder that selects good die for bonding or used to load tape carriers with good die or used to load trays that are used in pick and place machines (not shown). Depending on the manufacturing and assembly operations, the sawn and tested wafer shown in FIG. 4 is not usually immediately incorporated into a system and must be protected before use.

Figure 5:
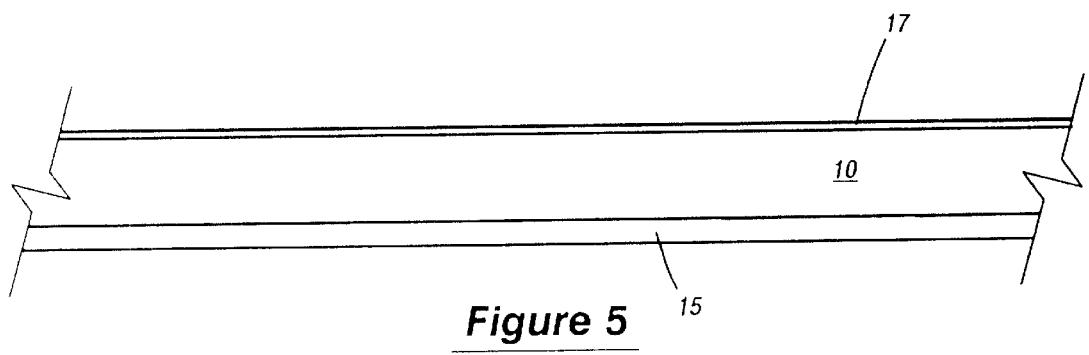
FIG. 5 is an enlarged section in elevation similar to FIG. 4 showing a removable protective coating applied to the present invention wafer before a sawing operation is performed.

Refer now to FIG. 5 showing an enlarged section in elevation of a clean wafer 10 similar to the wafer 10 in FIGS. 1 and 4 mounted on a flexible dicing tape or NITTO™ tape 15 before being diced or sawn. The wafer 10 is provided with a protective layer or film 17. The film may be sprayed or applied in a photo-resist spinner and then hardened by heat such as U.V. or I.R. or convection. In the preferred embodiment the film is water soluble to warm water under high pressure up to about 1400 pounds per square inch, but does not dissolve in the presence of cooling water used in dicing saws. The non-ionic film comprises water soluble U.V. curable protective coatings. The film 17 is insulative and covers the conductive electrodes or pads 12 shielding them from silicon dust and ESD.

Figure 6:
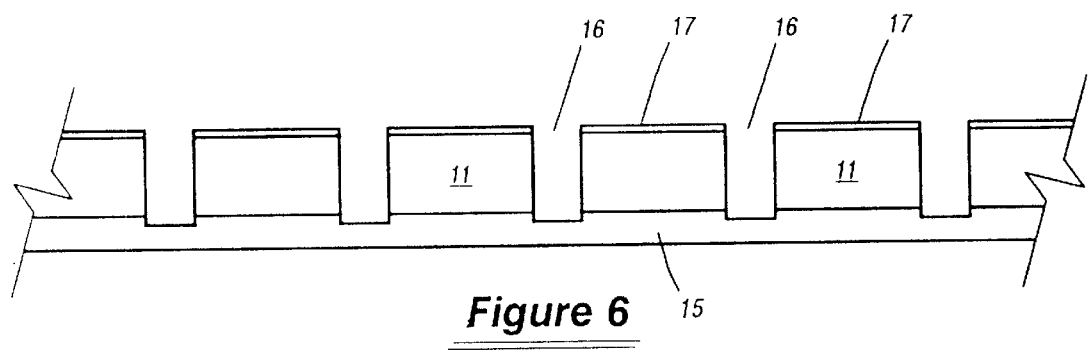
FIG. 6 is an enlarged section in elevation of the wafer shown in FIG. 5 after being sawn through the wafer but before removal of the protective coating.

Refer now to FIG. 6 showing the wafer of FIG. 5 after being sawn completely through the wafer and into the dicing tape 15 leaving separated die 11 attached to the dicing tape 15. When the wafer shown in FIG. 6 is washed in a wafer washer, the film 17 and all silicon dust is removed from the wafer 10, kerf 16 and pads 12. The clean wafer is ready for further processing into carriers etc. or die bonding before wire bonding.

Figure 7:
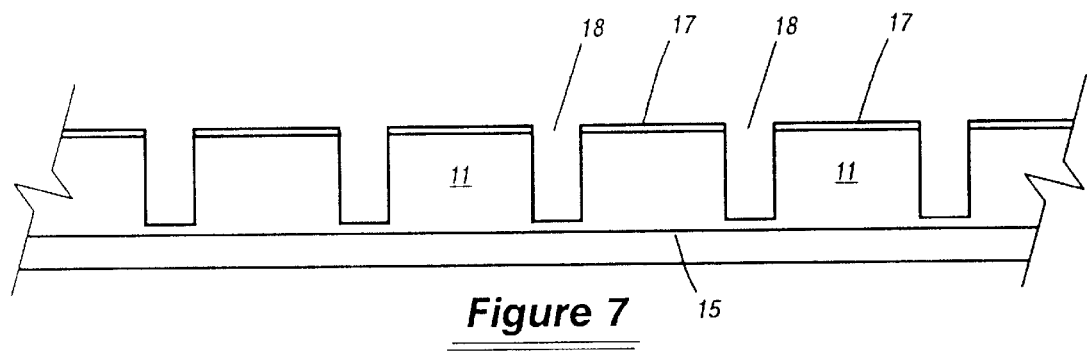
FIG. 7 is an enlarged section in elevation of another wafer of the type shown in FIG. 5 where the saw cut does not extend through the wafer to avoid bottom surface cracks and chips.

Refer now to FIG. 7 showing an enlarged section in elevation of a wafer 10 of the type shown in FIG. 5 after being diced or sawn with a shallow kerf or street that does not extend into the dicing tape 15. The depth of the kerf 18 is selected to prevent cracking or breaking in the bottom of the kerf 18. Before proceeding to the next step this wafer is washed in a wafer washer to remove all dust and contamination but need not remove any or all of the protective layer 17 which can be done in this process.

Figure 8:
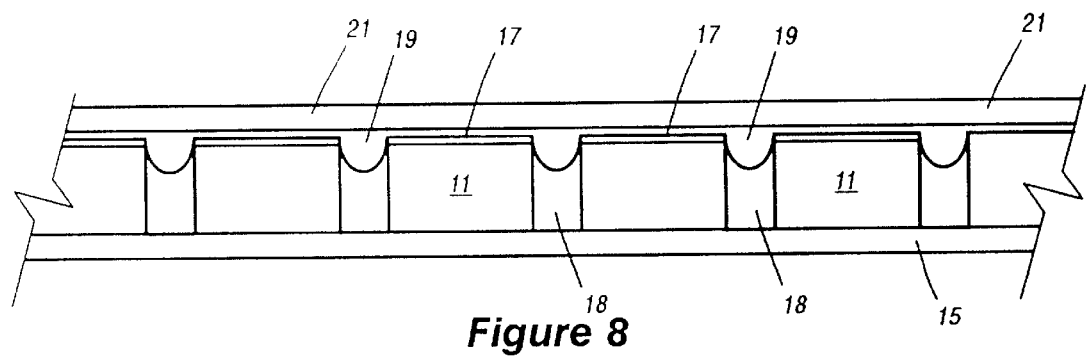
FIG. 8 is an enlarged section in elevation of the wafer shown in FIG. 7 after residue from the saw cut has been removed by washing and a second removable water soluble film and a back grinding tape is added on top of the wafer.

Refer now to FIG. 8 showing an enlarged section in elevation of the wafer shown in FIG. 7 after being washed and a second removable water soluble film 19 is applied on top of the first film 17, if present, or on top of the die 11 of the wafer. A back grinding tape 21, also available from NITTO DINKE CORP., is applied on top of the second film 19 to form a stiff or rigid sandwich having outer NITTO™ tapes 15 and 21.

Figure 9:
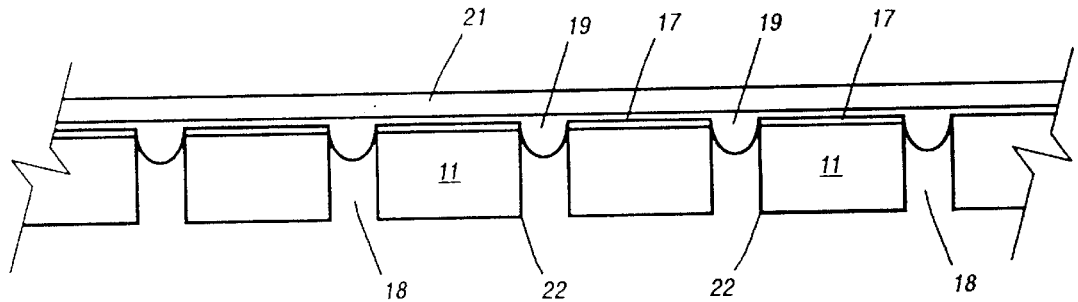
FIG. 9 is an enlarged section in elevation of the wafer shown in FIG. 8 after removal of the dicing tape and a portion of the bottom of the wafer.

Refer now to FIG. 9 showing an enlarged section in elevation of the wafer shown in FIG. 8 after tape 15 has been removed and the bottom of die 11 (wafer 10) has been ground or etched. Back grinding and plasma etch machines (not shown) are commercially available. The bottom edges 22 of the die 11 are free of chips and cracks, which could affect the circuitry as well as the exact size of small die. If the die 11 are to be mounted face down, like flip-chip with bumps and Ball Grid Arrays (BGA), a perfect bottom surface is desired for stacking die. The wafer in FIG. 9 is washed so as to remove all grinding and/or etching dust, but not to remove film 19 and/or 17 and keep die 11 in a properly spaced array.

Figure 10:
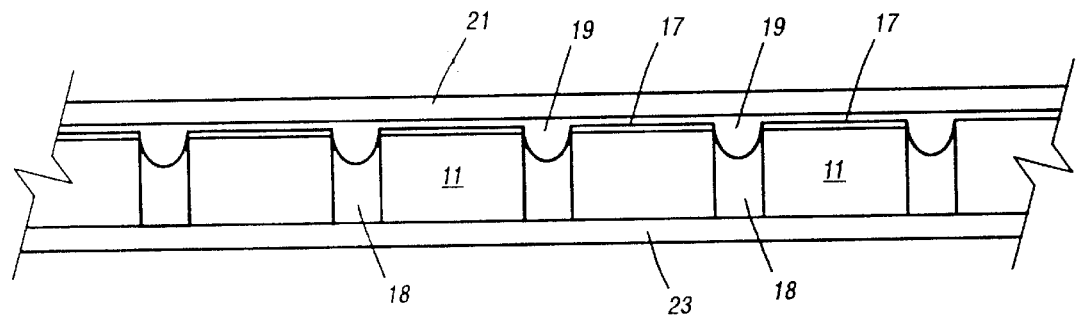
FIG. 10 is an enlarged section in elevation of the wafer shown in FIG. 9 after the wafer is washed and dried and a second dicing tape is applied to the bottom of the wafer.

Refer now to FIG. 10 showing the sandwich of die 11 in FIG. 9 after a second dicing tape 23 is applied to the bottom of the array of separated die.

Figure 11:
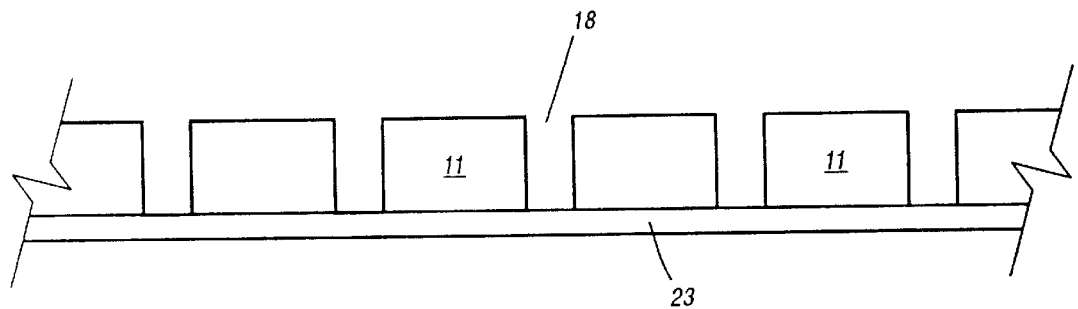
FIG. 11 is an enlarged section in elevation of the wafer shown in FIG. 10 after the back grinding tape and the second protective film is removed.

Refer now to FIG. 11 showing the sandwich of die 11 in FIG. 10 after removal of the back grinding tape 21 to permit removal of water soluble film 19, and/or 17, in a wafer washer using D.I. water or ultra clean D.I. water so as not to harm the protective electrodes 12. It is expected that some die 11 may be cleaned and washed with ultra clean tap water, however, this can vary from wafer to wafer and may not be worth the change in process, since the larger amount of D.I. water has already been saved from use in the dicing saw. It will be noted that the end result in FIG. 11 is an array of die on a dicing tape 23 ready for use.

Figure 12:
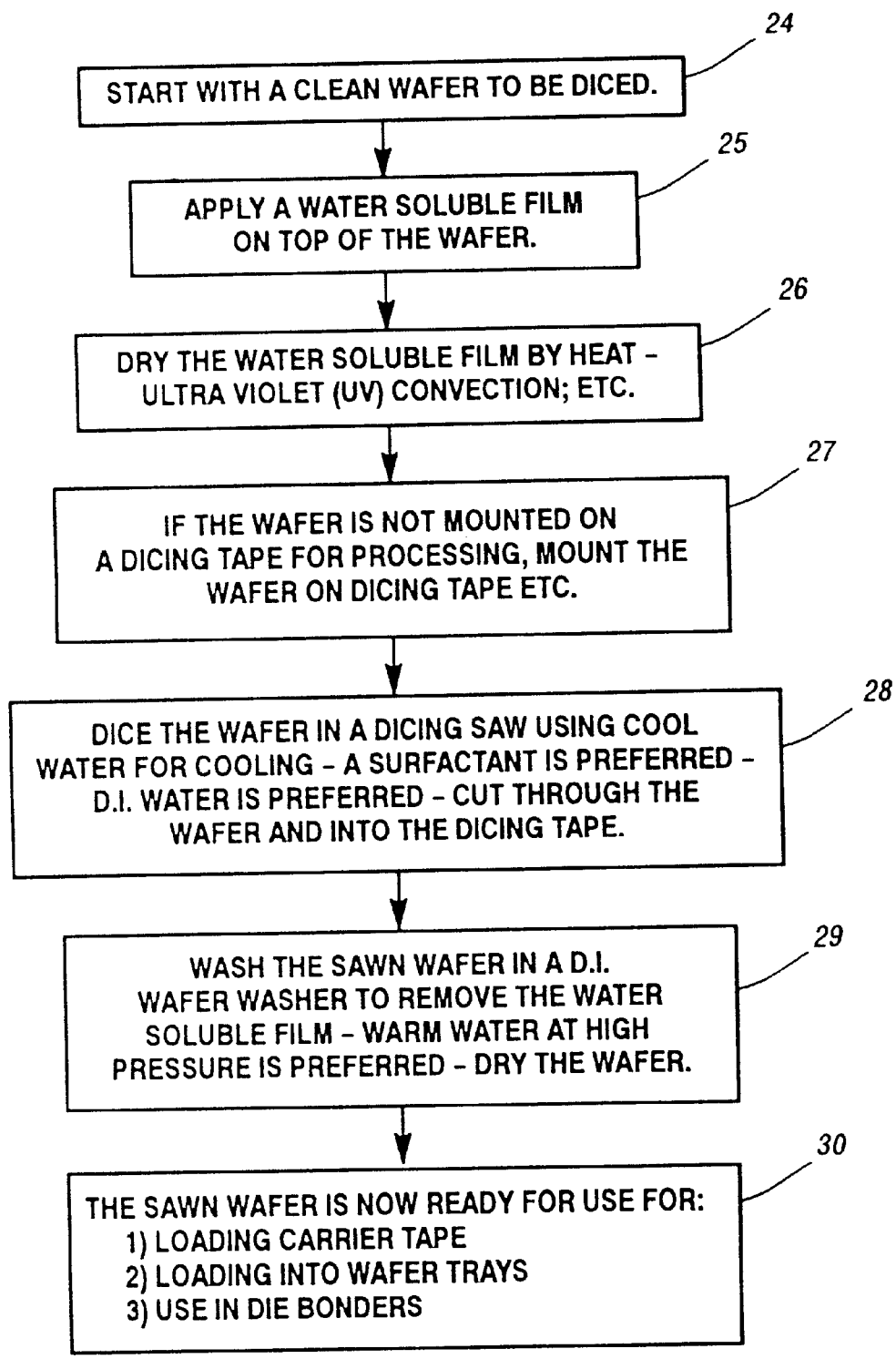
FIG. 12 is a block diagram of a specific example of steps employed to produce the protected wafer shown in FIG. 6 that may be washed and dried to provide the wafer shown in FIG. 4.

Refer now to FIG. 12 showing a block diagram with seven blocks and a specific example of steps 29–31 that may be employed to produce the protected wafer shown in FIGS. 5 and 6. Since some of the steps may be done in a different sequence, the example is specific and may be varied by those skilled in the wafer preparation art.

Steps 24 to 30 are considered self-descriptive and do not require an additional explanation. However, step 28 calls for the cooling water when sawing the wafer. It will be understood that ultra clean D.I. water is NOT required! Further, commercially available D.I. water is NOT required, thus, a saving of 50 gallons of D.I. water per saw per hour is available to those skilled enough to provide clean filtered cooling water. In any event the method results in ultra clean silicon dust-free bonding pads 12 which were not possible heretofore.

If the manufacturer is skilled enough to provide a clean filtered tap water, it can be used for cooling water in the saw, however, the last wash water in the washer needs to be ultra-clean D.I. water.

Figure 13:
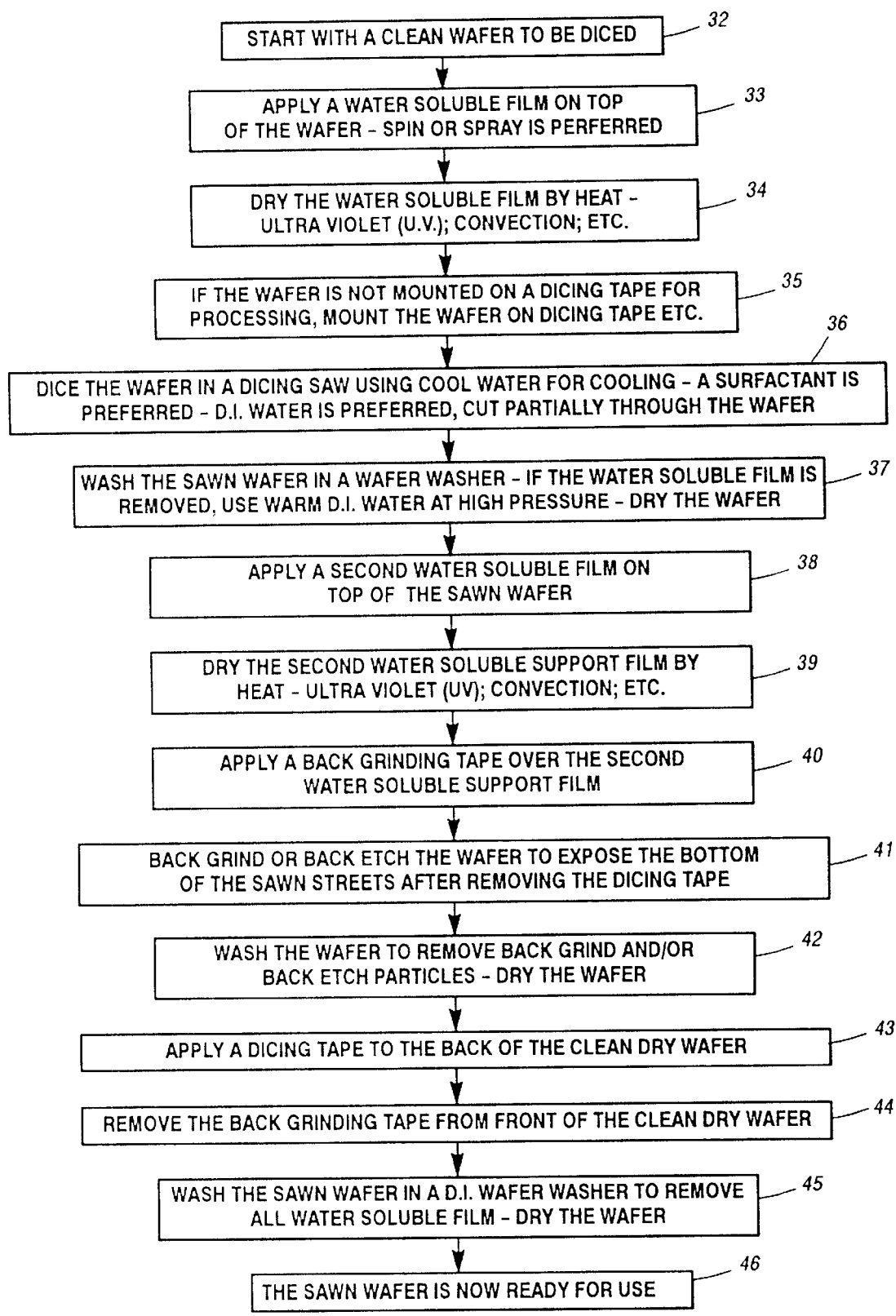
FIG. 13 is a block diagram of a specific example of steps employed to produce the wafer shown in FIG. 4 employing the wafer shown in FIGS. 5 and 7 to 11.

Refer now to FIG. 13 showing a block diagram with fifteen block and another specific example in which steps in blocks 32 to 46 may be varied in sequence. This method differs from the previous method in that two protective films 17 and 19 and two dicing tapes 15 and 23 are employed when using back grinding tape 21 to achieve perfect bottom edges 22 on the die 11.

The method shown in FIG. 13 at block 36 permits the same saving of ultra clean D.I. water or D.I. water as in block 28 of FIG. 12. However, in block 37 there is no need to use D.I. water if the protective film 17 is not removed from the electrodes or pads 12 until the last washing step 45.

The steps set forth in blocks 32 to 35 are self-descriptive and do not require further explanation in the specification and are incorporated herein by reference.

In summary, prior art wafers 10, having a clean upper surface with pads 12 (or electrodes) are coated with a protective coating 17 before dicing which keeps the pads 12 clean until the sawn die is ready for use. The film or protective coating 17 may be left on the wafer 10 until it is ready for use, thus, can serve as a protective coating during shipping and handling.

Many manufacturers of wafers and die supply complete wafers to assembly contractors that will place the die in carriers, in carrier tapes, in waffle trays or in other forms of carriers or pick the die direct from the dicing tape. Thus, the present invention not only increases the cleanliness of the bond pads, but reduces the cost of D.I. water in the process and provides additional protection to the wafer and die until ready for use.

Having explained a preferred method and variations of its use to provide ultra clean die pads and chip-free protected die, those skilled in this art may change the sequence of steps without departing from the claimed invention. Before and after tests with and without the protective film 17 show approximately 100% less silicon dust residue on the bonding pads 12!

What is claimed is:

1. A method of protecting wafer bonding pads from silicon wafer dust and contamination during singulation or Dicing, comprising the steps of:

providing a clean wafer to be saw cut mounted on a dicing tape;

applying a neutral hardened water soluble film over the surface of the wafer to be cut;

sawing through said water soluble film and said wafer and partially into said dicing tape;

cooling said wafer with clean cool water while sawing the wafer without removing the water soluble film;

washing said wafer in a wafer washer using high pressure clean warm deionized water to remove said neutral hardened water soluble film from the surface of individual sawn die and from the sawn kerf in said wafer; and drying said wafer prior to removing individual die from said wafer mounted on said dicing tape.

2. The method as set forth in claim 1 wherein said clean cool water comprises a non-deionized water which would ordinarily react with the exposed bonding pads of said die if not protected by the neutral hardened water soluble film.

3. The method as set forth in claim 1 wherein the step of applying a neutral hardened water soluble film comprises the step of applying a viscous liquid uniformly to the top surface of said wafer; and hardening and drying said film.

4. The method as set forth in claim 3 wherein the step of hardening and drying said film comprises exposing said film to ultraviolet (U.V.) or Infra Red (I.R.) radiation.

5. The method as set forth in claim 1 wherein the step of applying a film over the surface of the wafer comprises applying a viscous gel, paste or liquid.

6. A method of protecting wafer bonding pads from silicon wafer dust and contamination during separation from a wafer by a sawing operation, comprising the steps of:

mounting a clean wafer to be sawn into die on a first dicing tape;

applying a first neutral hardenable water soluble film on the top surface of the wafer to be sawn;

hardening the water soluble film to prevent it from dissolving in cool water;

sawing through said water soluble film and partially into said wafer;

washing said sawn wafer in a wafer washer to remove the wafer dust and water soluble film;

drying said washed and sawn wafer;

applying a second neutral hardenable water soluble film on the top surface of the wafer and into the sawn kerfs of said wafer;

hardening and drying said second neutral hardenable water soluble film;

applying a back grinding tape on top of said second film;

removing said dicing tape from the bottom of said partially sawn wafer;

removing a portion of the bottom of said wafer to separate the wafer into individual die having extremely clean edges on the die;

washing said sawn wafer in a wafer washing to remove wafer dust;

drying said washed and sawn wafer;

mounting said washed and sawn dry wafer on a second dicing tape; and removing said back grinding tape and said neutral hardenable water soluble film or films from said wafer to provide individual die with burr and crack free edges.

7. The method as set forth in claim 6 wherein the step of removing a portion of the bottom of said wafer comprises etching or back grinding.

8. The method as set forth in claim 6 wherein the step of washing said washed and sawn wafer after removing a portion of the bottom of said wafer comprises washing with clean cool water so as to not remove the water soluble film or films.

9. The method as set forth in claim 6 wherein the step of removing said neutral hardenable water soluble film or films from said wafer comprises washing said wafer in a wafer washer using high pressure deionized water to remove all soluble film and contaminates thereon.

10. The method as set forth in claim 6 wherein the step of sawing through said water soluble film and partially into said wafer further includes applying a stream of clean neutral cooling water to the blade of a dicing saw and to the wafer being cut.

11. The method as set forth in claim 10 wherein said clean neutral cooling water comprises a cleaned filtered tap water.

\* \* \* \* \*